United States Patent
Tajima et al.

(10) Patent No.: US 12,439,599 B2
(45) Date of Patent: Oct. 7, 2025

(54) SEMICONDUCTOR MEMORY DEVICE

(71) Applicant: Kioxia Corporation, Tokyo (JP)

(72) Inventors: Hikari Tajima, Tokyo (JP); Masayuki Kitamura, Yokkaichi Mie (JP); Seiichi Omoto, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 597 days.

(21) Appl. No.: 17/931,923

(22) Filed: Sep. 14, 2022

(65) Prior Publication Data
US 2023/0247833 A1 Aug. 3, 2023

(30) Foreign Application Priority Data
Feb. 3, 2022 (JP) .................. 2022-015650

(51) Int. Cl.
*H01L 27/1157* (2017.01)
*H10B 43/10* (2023.01)
*H10B 43/27* (2023.01)
*H10B 43/35* (2023.01)

(52) U.S. Cl.
CPC ............. *H10B 43/27* (2023.02); *H10B 43/10* (2023.02); *H10B 43/35* (2023.02)

(58) Field of Classification Search
CPC ......... H10B 43/35; H10B 43/27; H10B 43/10
See application file for complete search history.

(56) References Cited

U.S. PATENT DOCUMENTS

| | | | |
|---|---|---|---|
| 6,472,754 B2 | 10/2002 | Nakajima et al. | |
| 7,061,111 B2 | 6/2006 | McTeer | |
| 8,436,417 B2 | 5/2013 | Shimizu et al. | |
| 8,866,139 B2 | 10/2014 | Ino | |
| 11,302,707 B2* | 4/2022 | Hopkins | H10D 64/035 |
| 2018/0240702 A1* | 8/2018 | Morii | H01L 23/5226 |
| 2018/0261624 A1* | 9/2018 | Ishikura | H10D 30/0413 |
| 2020/0091080 A1* | 3/2020 | Wakatsuki | H10D 64/037 |
| 2021/0091009 A1* | 3/2021 | Datta | H01L 23/5226 |

(Continued)

FOREIGN PATENT DOCUMENTS

| | | |
|---|---|---|
| CN | 112582427 A | 3/2021 |
| JP | 2020-47702 A | 3/2020 |

OTHER PUBLICATIONS

Yi Wang et al., "Preparation and Characterization of MoB Coating on Mo Substrate," Metals, vol. 8, No. 2, Art. 93, 12 pages, DOI: 10.3390/met8020093 (2018).

*Primary Examiner* — Jaehwan Oh
(74) *Attorney, Agent, or Firm* — Finnegan, Henderson, Farabow, Garrett & Dunner, LLP (57) ABSTRACT

According to one embodiment, a semiconductor memory device includes a stacked body in which a plurality of conductive layers containing molybdenum (Mo) are stacked to be spaced apart from each other in a first direction, a pillar structure including a semiconductor layer extending in the first direction in the stacked body, a partition structure extending in the first direction and in a second direction intersecting the first direction in the stacked body, and dividing the stacked body in a third direction intersecting the first and second directions, and a plurality of intermediate layers, each including a portion provided between the pillar structure and a corresponding one of the conductive layers, and containing a compound of molybdenum (Mo) and boron (B).

20 Claims, 13 Drawing Sheets (56) References Cited

U.S. PATENT DOCUMENTS

| | | | |
|---|---|---|---|
| 2021/0098486 A1* | 4/2021 | Hopkins | H01L 21/02532 |
| 2022/0302160 A1* | 9/2022 | Yamashita | H10B 41/27 |
| 2022/0352193 A1* | 11/2022 | Said | H10B 41/27 |

* cited by examiner

SEMICONDUCTOR MEMORY DEVICE

CROSS-REFERENCE TO RELATED APPLICATIONS

This application is based upon and claims the benefit of priority from Japanese Patent Application No. 2022-015650, filed Feb. 3, 2022, the entire contents of which are incorporated herein by reference.

FIELD

Embodiments described herein relate generally to a semiconductor memory device.

BACKGROUND

It is important to ensure a high level of reliability for three-dimensional nonvolatile memories, in which multiple memory cells are stacked on a semiconductor substrate.

DETAILED DESCRIPTION

In general, according to one embodiment, a semiconductor memory device includes: a stacked body in which a plurality of conductive layers containing molybdenum (Mo) are stacked to be spaced apart from each other in a first direction; a pillar structure including a semiconductor layer extending in the first direction in the stacked body; a partition structure extending in the first direction and in a second direction intersecting the first direction in the stacked body, and dividing the stacked body in a third direction intersecting the first and second directions; and a plurality of intermediate layers, each including a portion provided between the pillar structure and a corresponding one of the conductive layers, and containing a compound of molybdenum (Mo) and boron (B).

Embodiments will be described hereinafter with reference to the accompanying drawings.

Figure 1:
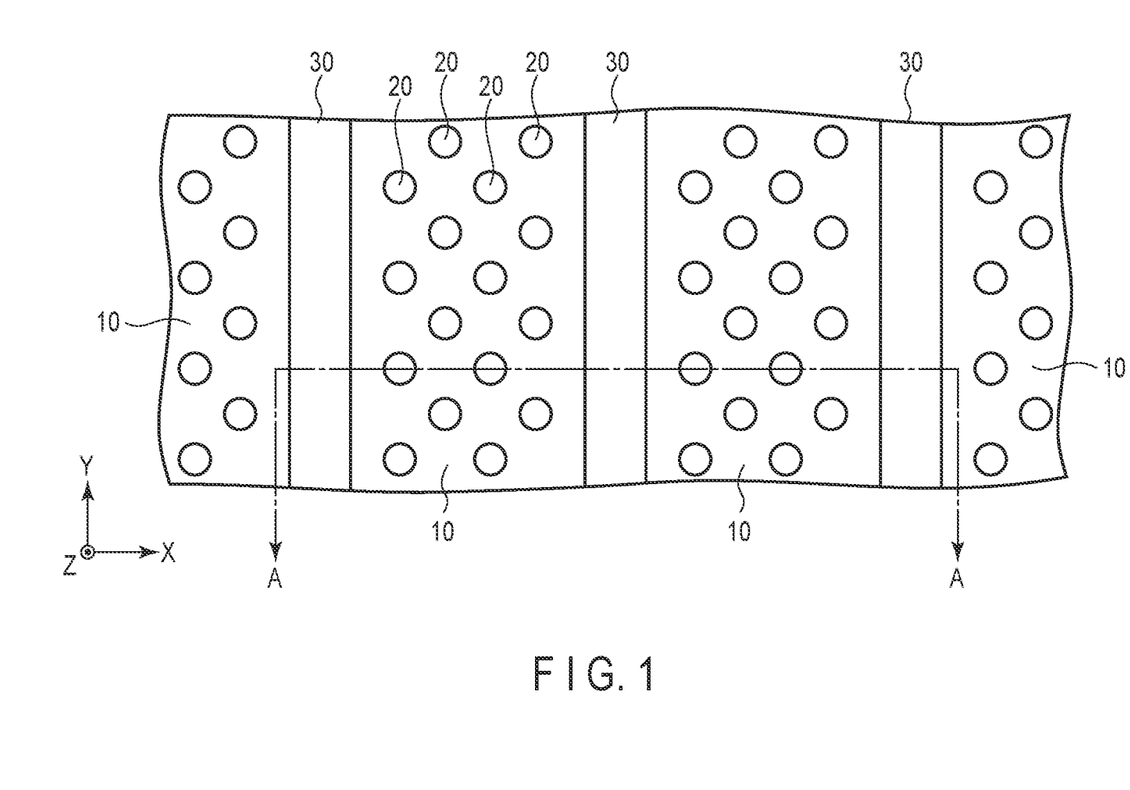
FIG. 1 is a diagram schematically showing a planar pattern of a basic configuration of a semiconductor memory device according to an embodiment.
Figure 2:
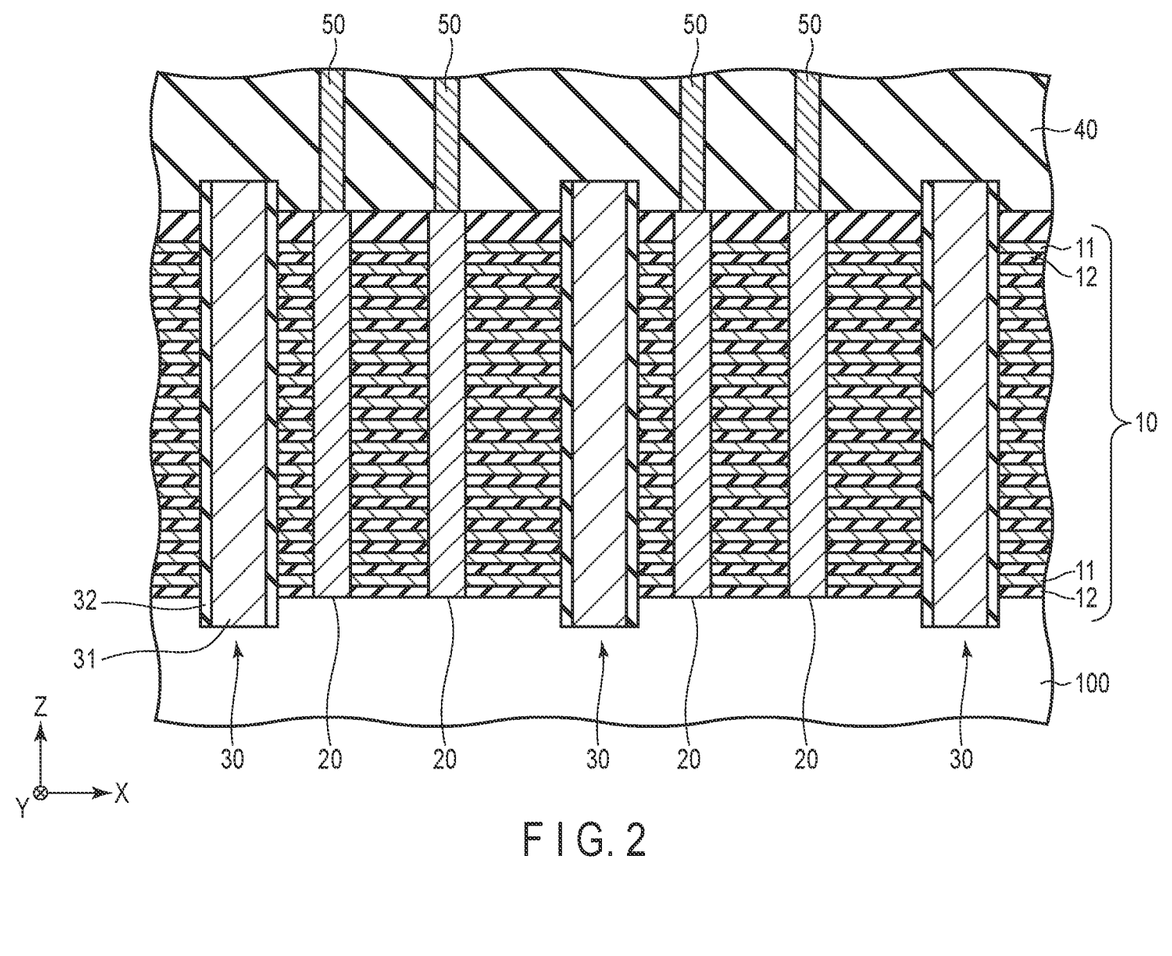
FIG. 2 is a cross-sectional view taken along line A-A in FIG. 1.

FIG. 1 is a diagram schematically showing a planar pattern of a basic configuration of a semiconductor memory device (NAND nonvolatile semiconductor memory device) according to an embodiment. FIG. 2 is a cross-sectional view taken along line A-A of FIG. 1. An X direction, a Y direction and a Z direction shown in each figure intersect each other. More specifically, the X direction, Y direction and Z direction are orthogonal to each other.

As shown in FIGS. 1 and 2, the semiconductor memory device of this embodiment comprises a stacked body 10, a plurality of pillar structures 20, a plurality of partition structures 30, an interlayer insulating layer 40, and a plurality of contacts 50.

The stacked body 10 is provided on a semiconductor substrate 100, and has a structure in which a plurality of conductive layers 11 and a plurality of insulating layers 12 are stacked alternately in the Z direction. That is, the conductive layers 11 are stacked to be spaced apart from each other in the Z direction and the conductive layers 11 are electrically insulated from each other by the insulating layers 12.

The conductive layers 11 are each formed of molybdenum (Mo). The insulating layers 12 are each formed of an insulating material such as silicon oxide or the like. Both the conductive layers 11 and the insulating layers 12 are provided parallel to an XY plane perpendicular to the Z direction. The conductive layers 11 function as electrode layers. More specifically, each of the conductive layers 11 functions as a word line or a select gate line.

Each of the pillar structures 20 extends in the Z direction in the stacked body 10 and includes a semiconductor layer extending in the Z direction and a charge storage layer surrounding a side surface of the semiconductor layer, and a lower end of the semiconductor layer is connected to a common source region. Here, a well region of the semiconductor substrate 100 may function as the common source region, or a source line as the common source region may be formed on the substrate via various types of elements, wiring lines and the like, which constitute the peripheral circuit.

The pillar structure 20 is surrounded by the conductive layers 11 and the insulating layers 12. The pillar structure 20 and the conductive layers 11 surrounding the pillar structure 20 form a NAND string including a plurality of memory cells connected in series and a plurality of select transistors provided on both ends of the memory cells connected in series.

More specifically, the conductive layer 11 surrounding the pillar structure 20 functions as a gate electrode, and a portion of the conductive layer 11, which functions as the gate electrode and a portion of the pillar structure 20, which is surrounded by the conductive layer 11 constitute the memory cell or the select transistor. That is, the memory cell is formed by the conductive layer 11 which functions as a word line and a portion of the pillar structure 20, which is surrounded by the conductive layer 11 functioning as the word line. Meanwhile, the select transistor is formed by the conductive layer 11 which functions as the select gate line and a portion of the pillar structure 20, which is surrounded by the conductive layer 11 functioning as the select gate line.

Each of the partition structures 30 extends in the Y direction and the Z direction in the stacked body 10. The stacked body 10 is divided into a plurality of portions in the X direction by the plurality of partition structures 30, and the pillar structures 20 are partitioned into a plurality of groups in the X direction. The partition structures 30 are arranged at substantially equal intervals in the X direction, and the number of rows of pillar structures 20 arranged between adjacent partition structures 30 is constant. Each region divided by the partition structures 30, for example, forms one block, which is an erase unit for data.

The partition structures 30 are each formed by filling a respective slit used in a replacement process, which will be described later, with a predetermined material, and each includes a conductive portion 31 formed of a conductive material and an insulating portion 32 formed of an insulating material. The conductive portion 31 includes a lower end, for example, connected to the common source region of the semiconductor substrate 100 and functions as a source contact. The partition structure 30 may be formed by filling a slit after the replacement process with only an insulating material without forming any conductive material functioning as a source contact.

The structure including the stacked body 10, the pillar structures 20 and the partition structures 30 is covered by an interlayer insulating layer 40. Further, the contacts 50 penetrate the interlayer insulating layer 40, and lower ends of the contacts 50 are connected to the semiconductor layers of the pillar structures 20 and the upper ends thereof are connected to the bit lines through vias, for example.

Figure 3:
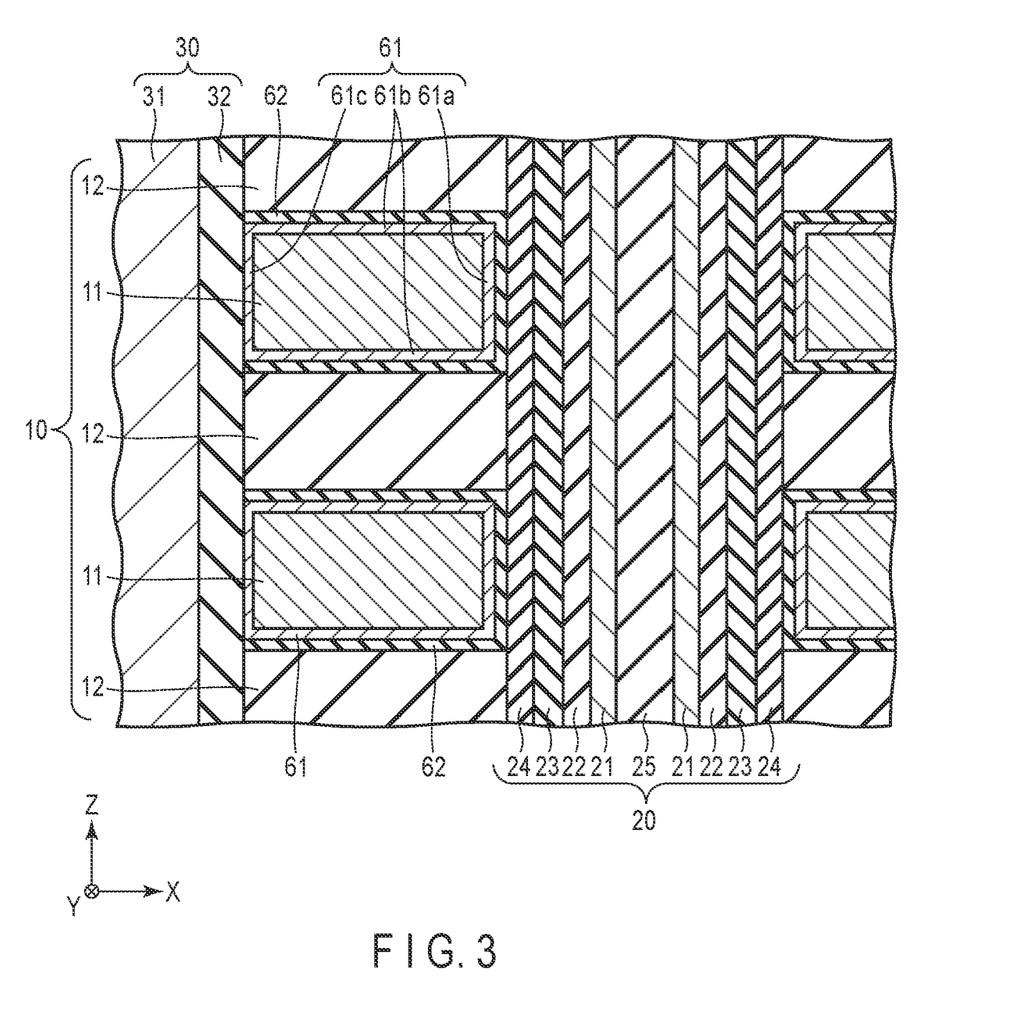
FIG. 3 is a cross-sectional view schematically showing a detailed configuration of a pillar structure, partition structure and the like, of the semiconductor memory device according to the embodiment.
Figure 4:
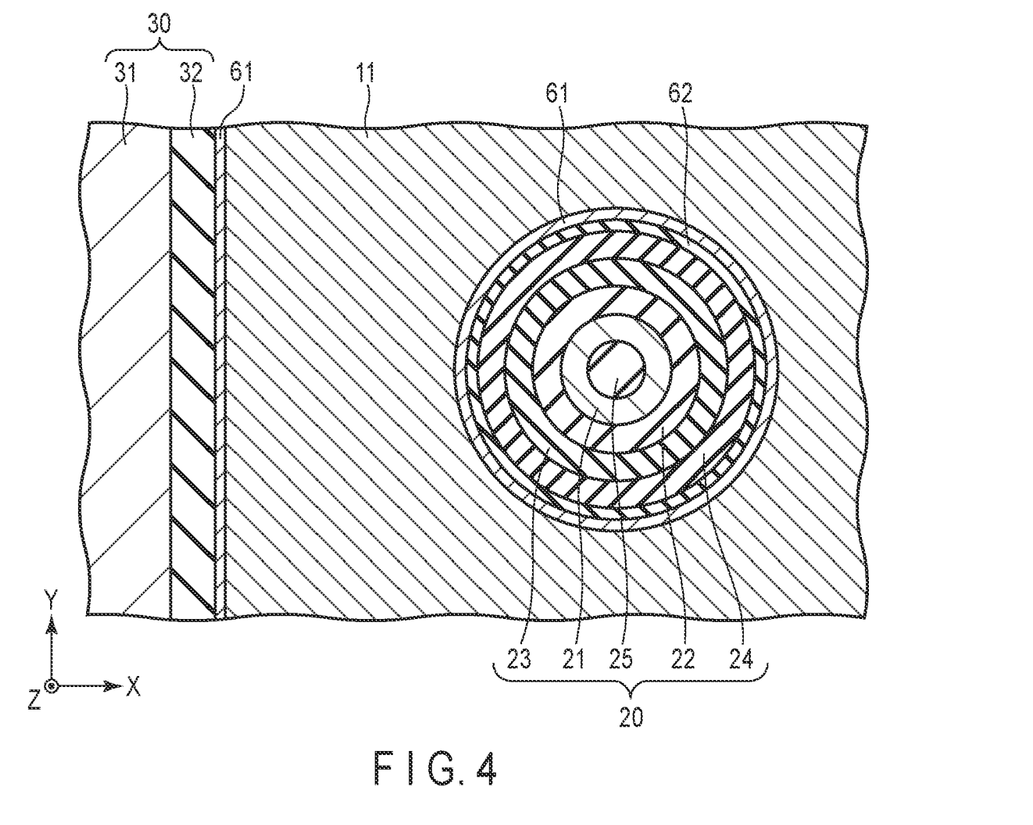
FIG. 4 is a cross-sectional view schematically showing a detailed configuration of the pillar structure, partition structure and the like, of the semiconductor memory device according to the embodiment.

FIGS. 3 and 4 are each a cross-sectional view schematically showing detailed configurations of the pillar structure 20 and the partition structure 30, and the like. FIG. 3 is a cross-sectional view in a direction parallel to the Z direction, and FIG. 4 is a cross-sectional view in a direction perpendicular to the Z direction.

The pillar structure 20 includes a semiconductor layer 21, a tunnel insulating layer 22, a charge storage layer 23, a block insulating layer 24, and a core insulating layer 25. The semiconductor layer 21, the tunnel insulating layer 22, the charge storage layer 23 and the block insulating layer 24 all have a cylindrical shape, and the core insulating layer 25 has a columnar shape. More specifically, the semiconductor layer 21 surrounds a side surface of the core insulating layer 25, the tunnel insulating layer 22 surrounds a side surface of the semiconductor layer 21, the charge storage layer 23 surrounds a side surface of the tunnel insulating layer 22, and the block insulating layer 24 surrounds a side surface of the charge storage layer 23. For example, the semiconductor layer 21 is formed of silicon, the tunnel insulating layer 22 is formed of silicon oxide, the charge storage layer 23 is formed of silicon nitride, the block insulating layer 24 is formed of silicon oxide, and the core insulating layer 25 is formed of silicon oxide.

On the surface of each conductive layer 11, an intermediate layer 61 is provided. More specifically, the intermediate layer 61 includes a first portion 61a, a second portion 61b and a third portion 61c.

The first portion 61a is provided between the pillar structure 20 and the conductive layer 11. The first portion 61a is provided along a side surface of the pillar structure 20 and surrounds the side surface of the pillar structure 20. The side surface of the first portion 61a is surrounded by the conductive layer 11 and is in contact with the conductive layer 11.

The second portion 61b is provided between the conductive layer 11 and the insulating layer 12. That is, the second portion 61b is provided along a lower surface and an upper surface of the conductive layer 11 and is in contact with the lower surface and upper surface of the conductive layer 11.

The third portion 61c is provided between the partition structure 30 and the conductive layer 11. That is, the third portion 61c is provided along a side surface of the partition structure 30 and a side surface of the conductive layer 11 and is in contact with the side surface of the conductive layer 11.

The intermediate layer 61 is formed of a compound of molybdenum (Mo) and boron (B) (molybdenum boride, which will be referred to as MoB hereinafter). The composition ratio of molybdenum (Mo) and boron (B) contained in the intermediate layer 61 is preferably approximately 1:1

The block insulating layer 62 is provided on an outer side of the pillar structure 20. More specifically, the block insulating layer 62 includes a portion provided between the pillar structure 20 and the conductive layer 11 (a portion provided between the pillar structure 20 and the first portion 61a of the intermediate layer 61), and a portion provided between the conductive layer 11 and the insulating layer 12 (a portion provided between the second portion 61b of the intermediate layer 61 and the insulating layer 12). In other words, between the conductive layer 11 and the block insulating layer 62, the first portion 61a and the second portion 61b of the intermediate layer 61 are provided.

For example, the block insulating layer 62 is formed of a compound of aluminum (Al) and oxygen (O) (aluminum oxide, $Al_2O_3$), a compound of zirconium (Zr) and oxygen (zirconium oxide, $ZrO_2$), a compound of hafnium (Hf) and oxygen (hafnium oxide, $HfO_2$) or the like.

As described above, in this embodiment, on the surface of the conductive layer 11 formed of molybdenum (Mo), an intermediate layer 61 formed of a compound of molybdenum (Mo) and boron (B), (MoB), is provided. With this configuration, it is possible in this embodiment to improve the reliability of the semiconductor memory device, as described below.

When the conductive layer 11 is formed of Mo, oxygen diffuses from the Mo layer to the pillar structure 20, which may degrade the characteristics and reliability of the pillar structure 20. In particular, oxygen diffuses into the block insulating layer 24 formed of silicon oxide, and the excess oxygen diffused into the block insulating layer 24 may generate a trap level as a risk. In the case, electrons in the charge storage layer 23 may be trapped at the trap level in the block insulating layer 24, and the data retention characteristics of the charge storage layer 23 may be deteriorated. As a result, such drawbacks may be created, in which the characteristics and reliability of the semiconductor memory device are deteriorated.

There are two possible major causes of oxygen diffusion from the conductive layer (Mo layer) 11. The first cause is considered that the oxygen contained in the source gas of Mo is mixed into the Mo layer, and the oxygen mixed into the Mo layer diffuses. The second cause is considered that the oxygen that has entered the Mo layer from the oxide layer formed on the surface of the Mo layer diffuses. Under these circumstances, it is desirable to suppress such diffusion of oxygen.

In this embodiment, mainly, by the first portion 61a of the intermediate layer 61, the diffusion of oxygen mixed in the Mo layer to the block insulating layer 24 can be suppressed. Further, mainly, by the third portion 61c of the intermediate layer 61, the formation of an oxide layer on the surface of the Mo layer can be suppressed. Thus, the diffusion of oxygen caused by the oxide layer can be suppressed.

Figure 5:
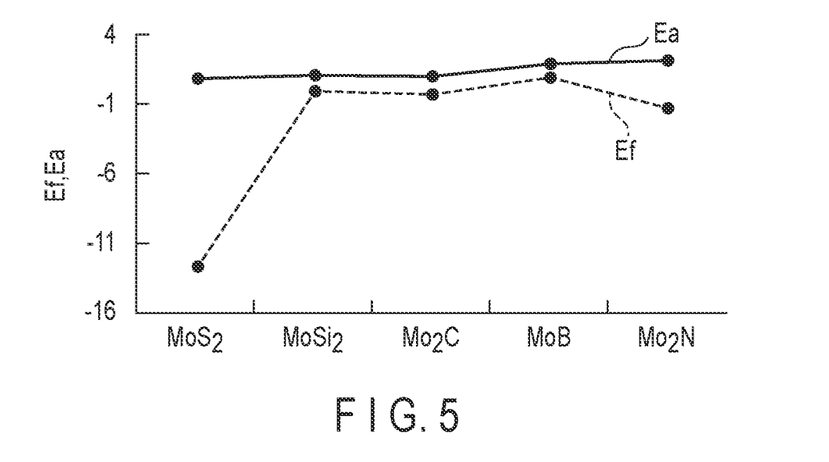
FIG. 5 is a diagram showing characteristics of a Mo compound, values of diffusion barrier Ea and values of formation energy Ef of oxygen.

FIG. 5 is a diagram showing the characteristics of some Mo compounds. More specifically, for $MoS_2$, $MoSi_2$, $Mo_2C$, MoB and $Mo_2N$, the value of the diffusion barrier Ea and the value of the formation energy Ef of oxygen are shown.

As shown in FIG. 5, both the value of Ea and the value of Ef are high for MoB. Therefore, by using the MoB layer as the intermediate layer 61, oxygen diffusion and oxide formation can be effectively suppressed. In particular, by setting the composition ratio of Mo and B to 1:1, the values of Ea and Ef can be increased.

As described above, in this embodiment, when the intermediate layer 61 formed of MoB is disposed on the surface of the conductive layer 11 formed of molybdenum (Mo), the data retention characteristics can be improved and the reliability of the semiconductor memory device can be enhanced.

FIGS. 6A to 6G are each a cross-sectional view schematically illustrating a manufacturing method of the semiconductor memory device in this embodiment.

Figure 6A:
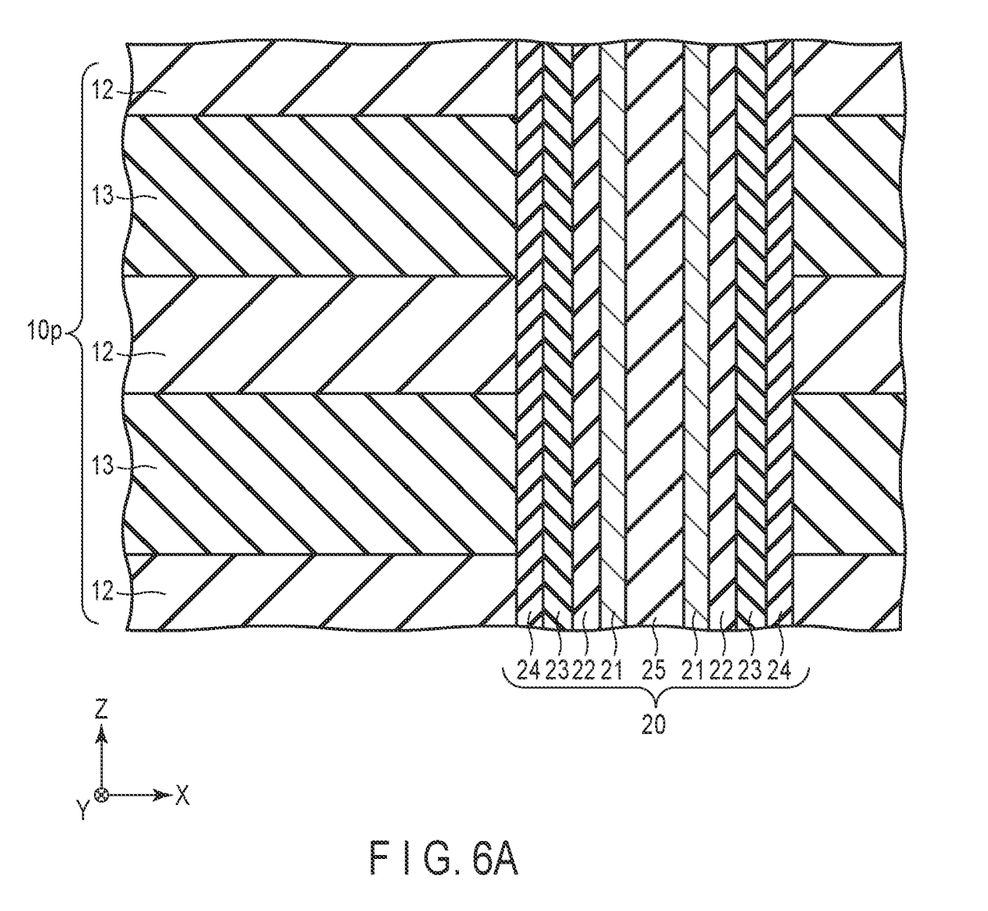
FIGS. 6A, 6B, 6C, 6D, 6E, 6F and 6G are each a cross-sectional view schematically showing a part of a method of manufacturing the semiconductor memory device according to the embodiment.

First, as shown in FIG. 6A, a structure containing a preliminary stacked body 10*p* and a pillar structure 20 is formed. The preliminary stacked body 10*p* has a structure in which a plurality of insulating layers 12 and a plurality of sacrificial layers 13 are alternately stacked in the Z direction.

Figure 6B:
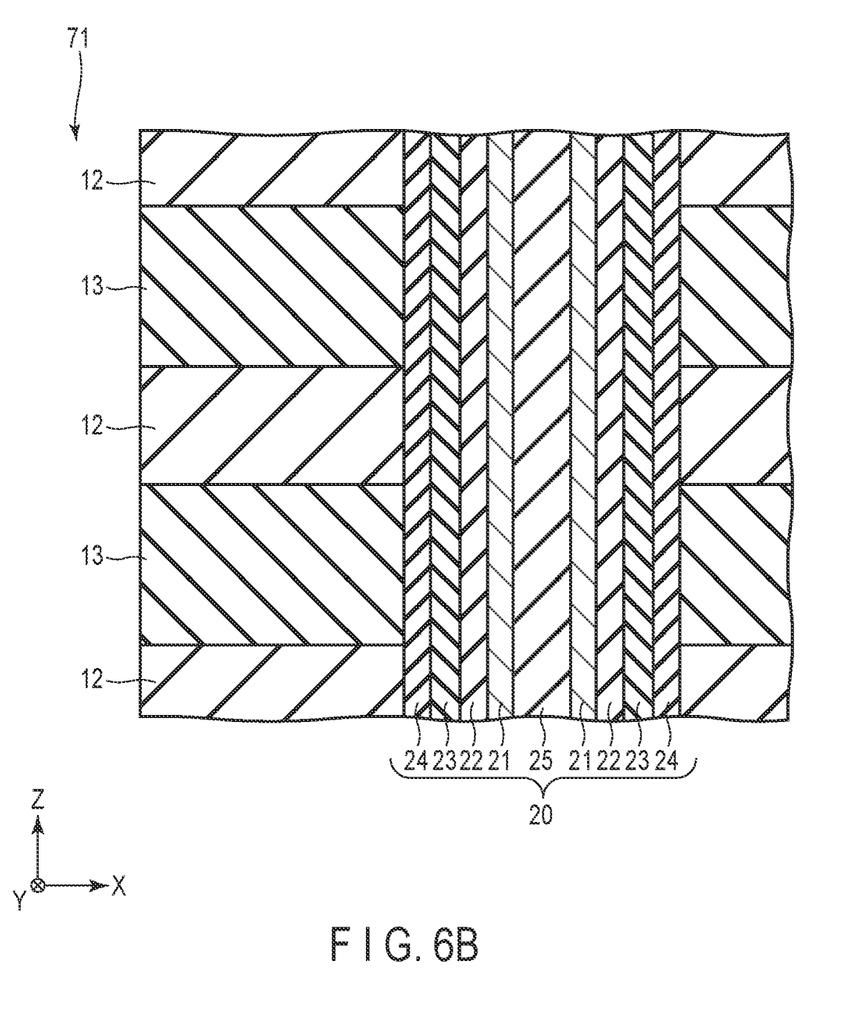

Next, as shown in FIG. 6B, by patterning the preliminary stacked body 10*p*, a slit 71 is formed to penetrate the preliminary stacked body 10*p* and extend in the Y direction and the Z direction.

Figure 6C:
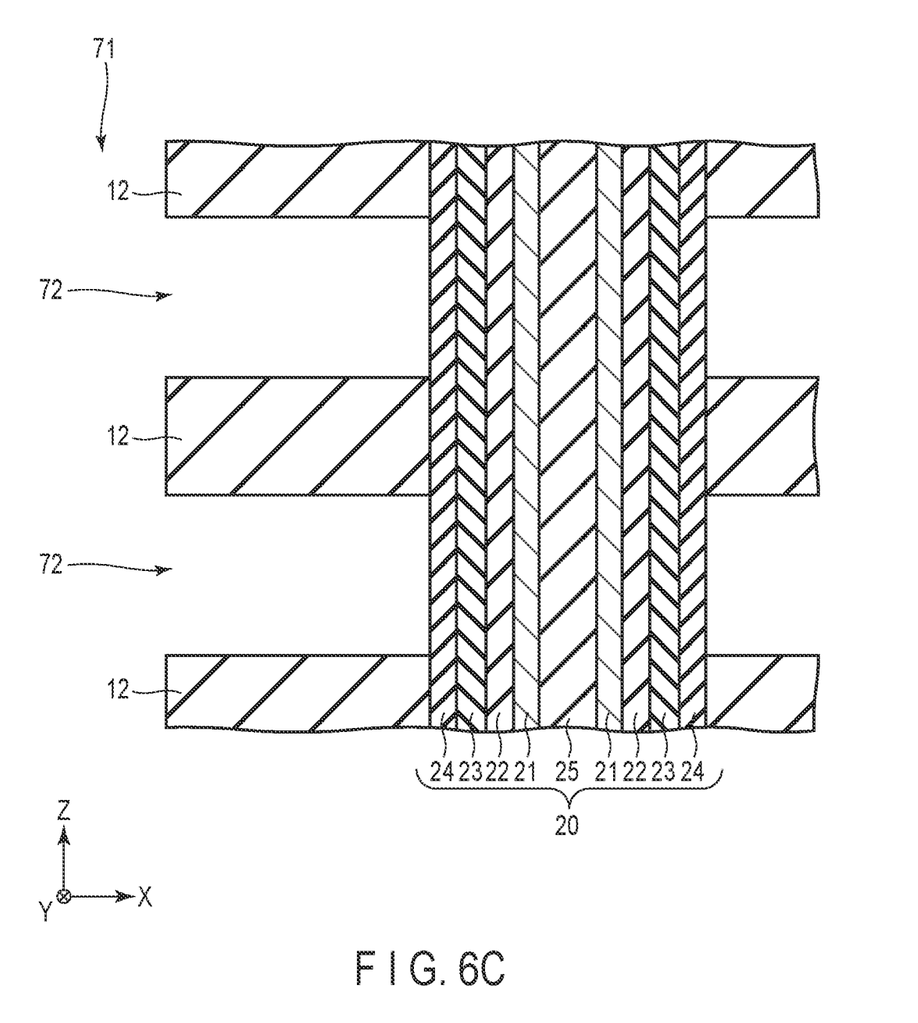

Next, as shown in FIG. 6C, the sacrificial layers 13 are etched through the slit 71 and thus the sacrificial layers 13 are removed. Thus, a plurality of spaces 72 are formed, each of which is provided between adjacent insulating layers 12.

Figure 6D:
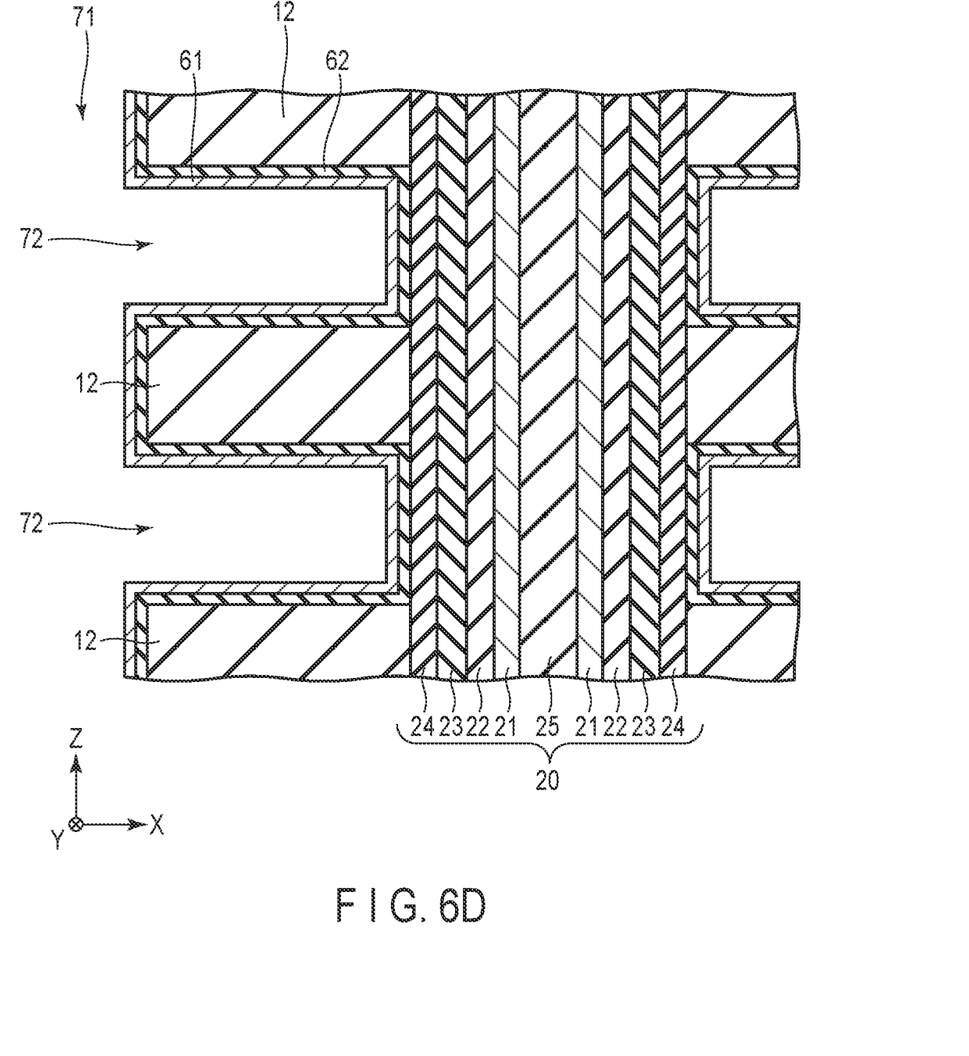

Next, as shown in FIG. 6D, on the surface of the slit 71 and the spaces 72, an $Al_2O_3$ layer, as the block insulating layer 62, is formed. Then, an MoB layer is formed as the intermediate layer 61 on the surface of the block insulating layer 62. More specifically, the MoB layer is deposited using a Mo-containing gas and a B-containing gas. For the Mo-containing gas, $MoO_2Cl_2$ is used, and for the B-containing gas, $BCl_3$ or $B_2H_6$ is used (note other B-based gases can as well be used), and thus the MoB layer is formed at a temperature of, for example, about 900° C. By adjusting the formation temperature appropriately, it is possible to form an MoB layer with a composition ratio of Mo and B of 1:1.

Figure 6E:
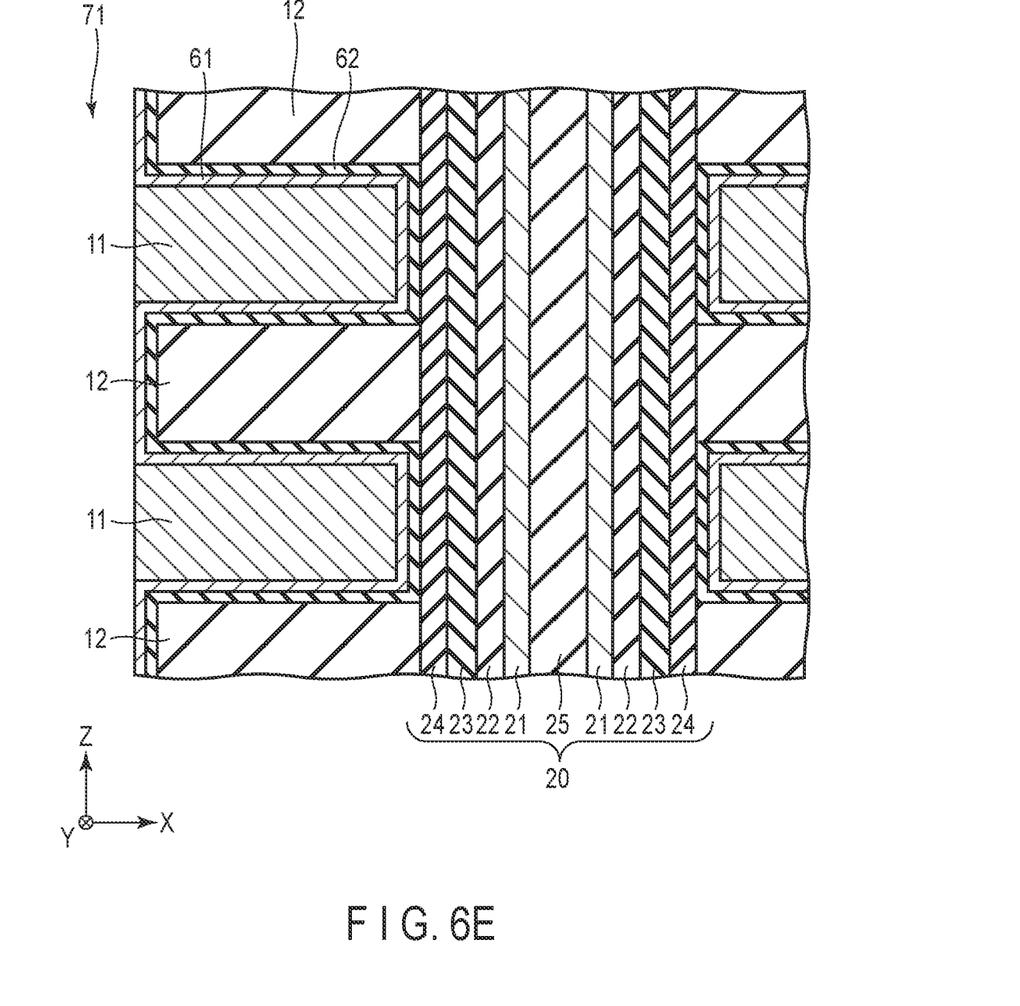

Next, as shown in FIG. 6E, in the spaces 72 in which the intermediate layer 61 and the block insulating layer 62 are formed, through the slit 71, an Mo layer is formed as the conductive layer 11, and the portions of the conductive layer 11 deposited at the positions corresponding to the side surfaces of the respective insulating layers 12 are removed.

Figure 6F:
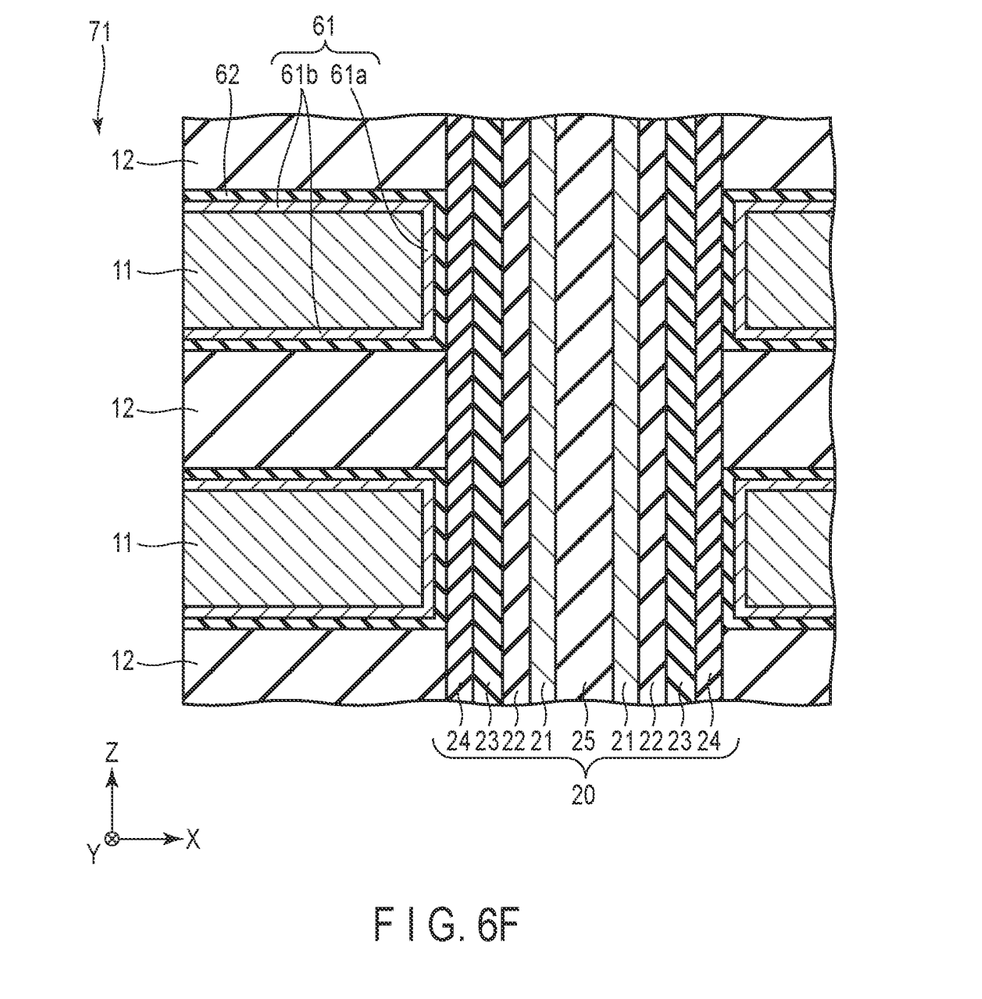

Next, as shown in FIG. 6F, the portions of the intermediate layer 61 and the block insulating layer 62 are removed to the positions corresponding to the side surfaces of the insulating layers 12. Thus, the first portion 61*a* and the second portion 61*b* of the intermediate layer (MoB layer) 61 are obtained. In this manner, the sacrificial layer 13 is replaced by the conductive layer (Mo layer) 11.

Figure 6G:
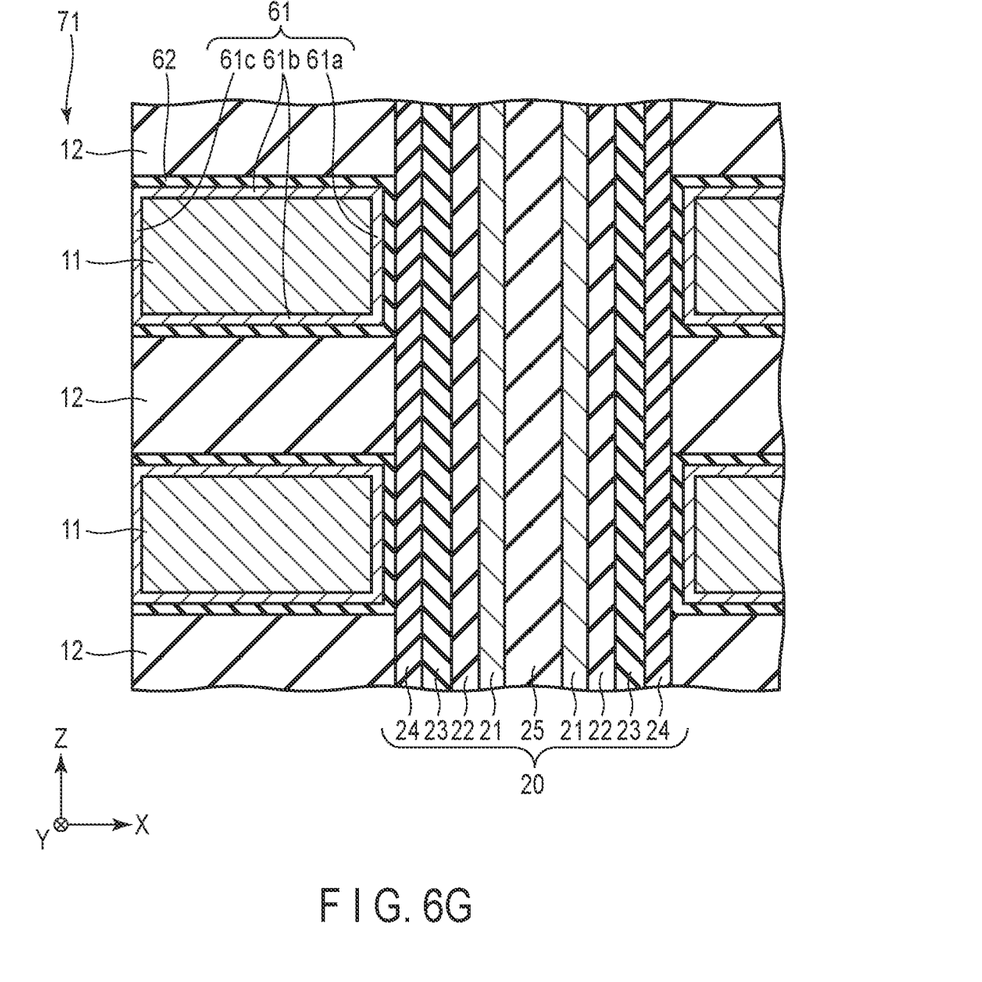

Next, as shown in FIG. 6G, in the state where the exposed side surfaces of the conductive layers (Mo layers) 11 are not exposed to the atmosphere, a B-containing gas is supplied to the exposed side surfaces of the conductive layers (Mo layers) 11, and thus the side surfaces of the conductive layers (Mo layers) 11 are boronized. Thus, the MoB layers are formed on the side surfaces of the conductive layers (Mo layers) 11, and the third portion 61*c* of the intermediate layer (MoB layer) 61 is obtained. For the B-containing gas, $BCl_3$ or $B_2H_6$ is used (other B-based gas may as well be used), and the MoB layer is formed at an appropriate temperature of, for example, about 900° C. Thus, the MoB layer with a composition ratio of Mo and B of 1:1, can be formed.

After that, as shown in FIG. 3, the insulating portion 32 and the conductive portion 31 are formed in the slit 71. Thus, a partition structure 30 is obtained.

With the manufacturing method described above, before forming the conductive layer (Mo layer) 11, the first portion 61*a* and the second portion 61*b* of the intermediate layer (MoB layer) 61 are formed, and the third portion 61*c* of the intermediate layer (MoB layer) 61 is formed on the exposed side surface of the conductive layer (Mo layer) 11. Thus, it is possible to suppress the oxygen mixed in the conductive layer (Mo layer) 11 from diffusing into the block insulating layer 24, and an oxide layer from being formed on the surface of the conductive layer (Mo layer) 11. Thus, a semiconductor memory device having high reliability can be obtained.

Note that in the embodiment described above, the intermediate layer 61 includes the first portion 61*a*, the second portion 61*b* and the third portion 61*c*, but it suffices if the intermediate layer 61 includes at least one of the first portion 61*a* and the third portion 61*c*.

Next, a modified example of this embodiment will be described. In this modified example, the intermediate layer 61 includes a first portion 61*a* and a second portion 61*b* and does not includes a third portion 61*c*.

Figure 7A:
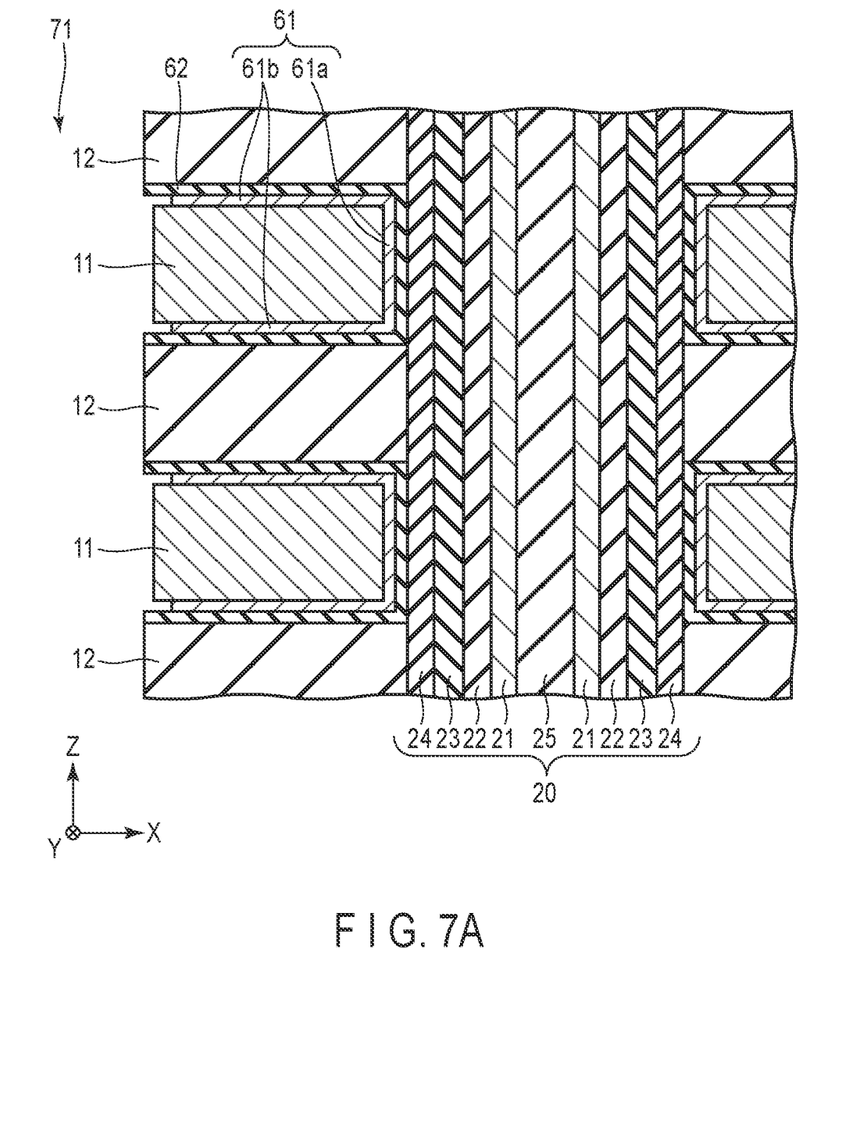
FIGS. 7A and 7B are each a cross-sectional view schematically showing a part of a method of manufacturing a modified example of the semiconductor memory device according to the embodiment.
Figure 7B:
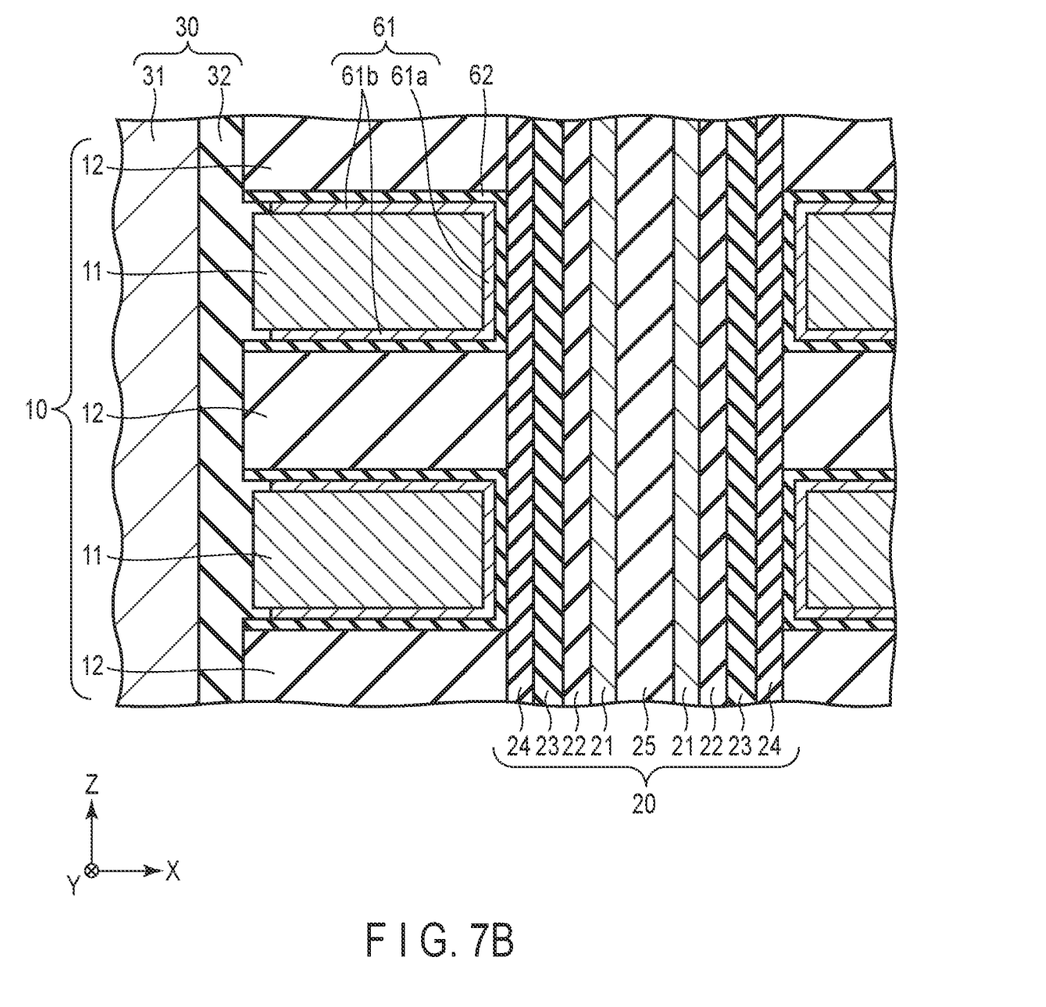

FIGS. 7A and 7B are each a cross-sectional view schematically illustrating a manufacturing method of this modified example.

In this modified example, after the processing step of FIG. 6E of the embodiment described above, a part of the conductive layer (Mo layer) 11, a part of the intermediate layer 61 and a part of the block insulating layer 62 are removed by etching as shown in FIG. 7A. At this time, the etching amount is adjusted such that the position of the side surface of the conductive layer (Mo layer) 11 and the position of the side surface of the second portion 61*b* of the intermediate layer 61 are recessed toward the pillar structure 20 side relative to the position of the side surface of the insulating layer 12. In the example shown in FIG. 7A, the position of the side surface of the second portion 61*b* of the intermediate layer 61 is recessed to the pillar structure 20 side relative to the position of the side surface of the conductive layer (Mo layer) 11 as well.

Next, as shown in FIG. 7B, on the recessed side surfaces of the conductive layer (Mo layer) 11 and the intermediate layer (MoB layer) 61 and the side surfaces of the insulating layer 12 and the block insulating layer 62, a silicon oxide layer is formed as the insulating portion 32 of the partition structure 30. At this time, the insulating portion 32 is formed while the conductive layer (Mo layer) 11 and the like is not exposed to the atmosphere. Further, the conductive portion 31 is formed in the slit 71 in which the insulating portion 32 is formed. In this manner, the partition structure 30 is obtained.

As described above, in this modified example, the third portion 61*c* of the intermediate layer (MoB layer) 61 is not formed, but the insulating portion 32 of the partition structure 30 is formed in the state where the conductive layer (Mo layer) 11 and the like is not exposed to the atmosphere, thereby making it possible to suppress the formation of an oxide layer that can be a source of oxygen diffusion to the conductive layer (Mo layer) 11. Therefore, in this modified example as well, it is possible to obtain a semiconductor memory device having high reliability as in the case of the embodiment described above.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
a stacked body in which a plurality of conductive layers containing molybdenum (Mo) are stacked to be spaced apart from each other in a first direction;
a pillar structure including a semiconductor layer extending in the first direction in the stacked body;
a partition structure extending in the first direction and in a second direction intersecting the first direction in the stacked body, and dividing the stacked body in a third direction intersecting the first and second directions; and
a plurality of intermediate layers, each including a portion provided between the pillar structure and a corresponding one of the conductive layers, and containing a compound of molybdenum (Mo) and boron (B).

2. The device of claim 1, wherein
each of the plurality of intermediate layers further includes portions provided along a lower surface and an upper surface of the corresponding one of the conductive layers.

3. The device of claim 2, wherein
each of the plurality of intermediate layers further includes a portion provided between the partition structure and the corresponding one of the conductive layers.

4. The device of claim 2, wherein
each of the plurality of intermediate layers does not include a portion provided between the partition structure and the corresponding one of the conductive layers.

5. The device of claim 4, wherein
positions of side surfaces of the portions provided along the lower surface and the upper surface of the corresponding one of the conductive layers are recessed on a side of the pillar structure relative to a position of a side surface of the corresponding one of the conductive layers.

6. The device of claim 1, wherein
each of the plurality of intermediate layers further includes a portion provided between the partition structure and the corresponding one of the conductive layers.

7. The device of claim 1, wherein
a composition ratio of molybdenum (Mo) and boron (B) contained in each of the plurality of intermediate layers is approximately 1:1.

8. The device of claim 1, further comprising:
a plurality of first block insulating layers each including a portion provided between the pillar structure and the corresponding one of the conductive layers,
wherein
each of the plurality of intermediate layers is provided between the corresponding one of the conductive layers and a corresponding one of the first block insulating layers.

9. The device of claim 8, wherein
each of the plurality of first block insulating layers contains at least one of a compound of aluminum (Al) and oxygen (O), a compound of zirconium (Zr) and oxygen (O), or a compound of hafnium (Hf) and oxygen (O).

10. The device of claim 1, wherein
the pillar structure further includes a charge storage layer surrounding a side surface of the semiconductor layer.

11. The device of claim 10, wherein
the pillar structure further includes a second block insulating layer surrounding a side surface of the charge storage layer and containing silicon oxide.

12. The device of claim 1, wherein
the partition structure includes a conductive portion.

13. The device of claim 1, wherein
the stacked body includes a structure in which the plurality of conductive layers and a plurality of insulating layers are stacked alternately in the first direction.

14. A semiconductor memory device comprising:
a stacked body in which a plurality of conductive layers containing molybdenum (Mo) are stacked to be spaced apart from each other in a first direction;
a pillar structure including a semiconductor layer extending in the first direction in the stacked body;
a partition structure extending in the first direction and in a second direction intersecting the first direction in the stacked body, and dividing the stacked body in a third direction intersecting the first and second directions; and
a plurality of intermediate layers, each including a portion provided between the partition structure and a corresponding one of the conductive layers, and containing a compound of molybdenum (Mo) and boron (B).

15. The device of claim 14, wherein
each of the plurality of intermediate layers further includes portions provided along a lower surface and an upper surface of the corresponding one of the conductive layers.

16. The device of claim 14, wherein
a composition ratio of molybdenum (Mo) and boron (B) contained in each of the plurality of intermediate layers is approximately 1:1.

17. The device of claim 14, wherein
the pillar structure further includes a charge storage layer surrounding a side surface of the semiconductor layer.

18. The device of claim 17, wherein
the pillar structure further includes a block insulating layer surrounding a side surface of the charge storage layer and containing silicon oxide.

19. The device of claim 14, wherein
the partition structure includes a conductive portion.

20. The device of claim 14, wherein
the stacked body includes a structure in which the plurality of conductive layers and a plurality of insulating layers are stacked alternately in the first direction.

* * * * *